United States Patent [19]

Ham

[11] Patent Number: 5,898,193

[45] Date of Patent: Apr. 27, 1999

[54] ELECTROSTATIC DISCHARGE PROTECTING CIRCUIT FORMED IN A MINIMIZED AREA

[75] Inventor: Seog-Heon Ham, Seoul, Rep. of Korea

[73] Assignee: Samsung Electronics, Co., Ltd., Suwon, Rep. of Korea

[21] Appl. No.: 08/963,105

[22] Filed: Nov. 3, 1997

[30] Foreign Application Priority Data

Nov. 2, 1996 [KR] Rep. of Korea .................. 96 51681

[51] Int. Cl.[6] .......................... H01L 29/74; H01L 23/62; H01L 29/00
[52] U.S. Cl. ...................... 257/173; 257/355; 257/546
[58] Field of Search .............................. 257/355, 356, 257/357, 358, 359, 360, 361, 362, 363, 546, 547, 173

[56] References Cited

U.S. PATENT DOCUMENTS

| | | | |
|---|---|---|---|
| 5,548,134 | 8/1996 | Tailliet | 257/173 |
| 5,682,047 | 10/1997 | Consiglio et al. | 257/360 |

Primary Examiner—Tom Thomas
Assistant Examiner—Ori Nadav
Attorney, Agent, or Firm—Marger, Johnson, & McCollum P.C.

[57] ABSTRACT

Disclosed is an electrostatic discharge (ESD) protecting circuit, capable of consuming a high voltage or overcurrent applied to a semiconductor circuit device and thereby protecting the circuit device from the instant ESD impact. The ESD protecting circuit according to this invention has only two wells and a highly doped region which brings an N-well into an electrical connection with the P-well. Accordingly, the present invention provides effects of reducing the area of the ESD protecting circuit and removing an instant ESD impact.

15 Claims, 2 Drawing Sheets

ELECTROSTATIC DISCHARGE PROTECTING CIRCUIT FORMED IN A MINIMIZED AREA

BACKGROUND OF THE INVENTION

1. Field of the Invention

The present invention relates to an electrostatic discharge protecting circuit in a semiconductor device, and more particularly to an electrostatic discharge protecting circuit capable of protecting an internal circuit in a semiconductor device, by minimizing the occupying area thereof.

2. Brief Description of Related Arts

In general, an electrostatic discharge protecting circuit has been widely used to prevent overvoltage from being applied to the internal circuit in the semiconductor device. FIG. 1 is a schematic view illustrating the configuration of a conventional electrostatic discharge protecting circuit. As shown in FIG. 1, the conventional electrostatic discharge (referred to herein as an ESD) protecting circuit is connected to an input/output (I/O) pad which is formed between the ground voltage level Vdd and the power supply Vss in the semiconductor device. To discharge overcurrent from an external circuit, the ESD protection circuit has three current discharging paths provided by a P+/N-well diode 18 and N+/P-well diodes 20 and 22. The first and second current discharging paths are provided by the P+/N-well diode 18 and the N+/P-well diode 20, respectively. The P+/N-well diode 18 is formed between the power supply Vdd and the I/O pad, and the N+/P-well diode 20 is formed between the I/O pad and the ground voltage level Vss. Also, the third current discharging path is provided by the N+/P-well diode 22 formed between the power supply Vdd and the ground voltage level Vss.

FIG. 2 is a sectional view illustrating the detailed structure of the ESD protecting circuit shown in FIG. 1. As shown in FIG. 2, the conventional ESD protection circuit includes a plurality of P-well regions 26, 32 and 34, which are formed by implanting P-type impurity ions into a semiconductor substrate 24, a plurality of N-well regions 28 and 30, which are formed by implanting N-type impurity ions into the semiconductor substrate 24, and a plurality of field oxide layers 360 to 371 spaced apart from one another in order to define active and non-active regions in the semiconductor device 24. Further, the conventional ESD protection circuit includes P+-type impurity regions 381 to 386 and N+-type impurity regions 401 to 405 which are formed between the field oxide layers 360 to 371, respectively. The concentration of the P+-type impurity regions 381 to 386 is higher than that of the P-well regions 26, 32 and 34 and also the concentration of the N+-type impurity regions 401 to 405 is higher than that of the N-well regions 28 and 30.

The P+-type impurity regions 381, 382 and 384 to 386 formed in the P-well regions 26, 32 and 34 are connected to the ground voltage level Vss, and the N+-type impurity regions 402 to 404 formed in the N-well regions 28 and 30 are connected to the voltage supply Vdd. Furthermore, one of N+-type impurity regions 401 and 405 in the P-well regions 26 and 34, for example, the N+-type impurity region 401 and the P+-type impurity region 383 formed in the N-well region 30 are connected to the I/O pad. On the other hand, the N+-type impurity region 405 in the P-well region 34 are connected to the power supply Vdd.

As described above, between the I/O pad and the power supply Vdd, the first current discharging path is formed by the P+/N-well diode due to the junction of the P+-type impurity region 383 and the N-well region 30. The second current discharging path, between the I/O pad and the ground voltage level Vss, is formed by the N+/P-well diode due to the junction of the N+-type impurity region 401 and the P-well region 26, and, between the ground voltage level Vss and the power supply Vdd, the third current discharging path is formed by the N+/P-well diode due to the junction of the N+-type impurity region 405 and the P-well region 34.

However, because the conventional ESD protecting circuit has a plurality of well regions forming the current discharging paths, it has problems in that the lay-out is very complicated and it is in need of a large area in the semiconductor device.

SUMMARY OF THE INVENTION

Therefore, an object of the present invention is to solve the above-mentioned problems encountered in the prior art and, thus, to provide an improved ESD protecting circuit for a semiconductor device, capable of minimizing its area.

In accordance with an aspect of the present invention, there is provided an electrostatic discharge (ESD) protecting circuit, which is formed on a semiconductor substrate, including a first current discharging path between an input/out pad and a first power supply, a second current discharging path between said input/out pad and a second power supply and a third current path between said first power supply and said second power supply, said ESD protecting circuit comprising: a first N+-type impurity region formed on both a p-well and an N-well which are formed in said semiconductor substrate in order to form said third current path, wherein said P-well is in contact with said N-well, whereby an N+/P-well diode is formed between said first power supply and said second power supply.

In accordance with another aspect of the present invention, there is provided an electrostatic discharge (ESD) protecting circuit for a semiconductor device, said ESD protecting circuit comprising: an N-well formed in a semiconductor substrate; a P-well formed in a semiconductor substrate, being in contact with said N-well; an N+/P-well diode formed on said P-well to form a first current path between an input/out pad and a first power supply; a P+/N-well diode formed on said N-well to form a second current path between said input/out pad and a second power supply; and a first N-type impurity region electrically coupling said N-well to said P-well to form a third current path between said first power supply and said second power supply.

In accordance with further another aspect of the present invention, there is provided a semiconductor circuit device including an input/output pad, a first power supply, a second power supply and an internal circuit, said semiconductor circuit comprising: an electrostatic discharge (ESD) protecting circuit for protecting said internal circuit from overvoltage input from an external circuit, said ESD protecting circuit including: a first well region formed in a semiconductor substrate with a first impurity type; a second well region formed in said semiconductor substrate with a second impurity type, being in contact with said first well region; a plurality of field regions spaced apart from one another; a first impurity region formed on both said first well region and said second well region; a second impurity region formed on said first well region, coupled to said input/output pad; a third impurity region formed on said second well region, coupled to said input/output pad; a fourth impurity region formed on said first well region, coupled to said first power supply; and a fifth impurity region formed on said second well region, coupled to said second power supply.

BRIEF DESCRIPTION OF THE DRAWINGS

Other objects and aspects of the present invention will become apparent from the following description of embodiments with reference to the accompanying drawings in which.

DETAILED DESCRIPTION OF THE PREFERRED EMBODIMENTS

Hereinafter, the present invention will be described referring to FIG. 3.

Figure 1:
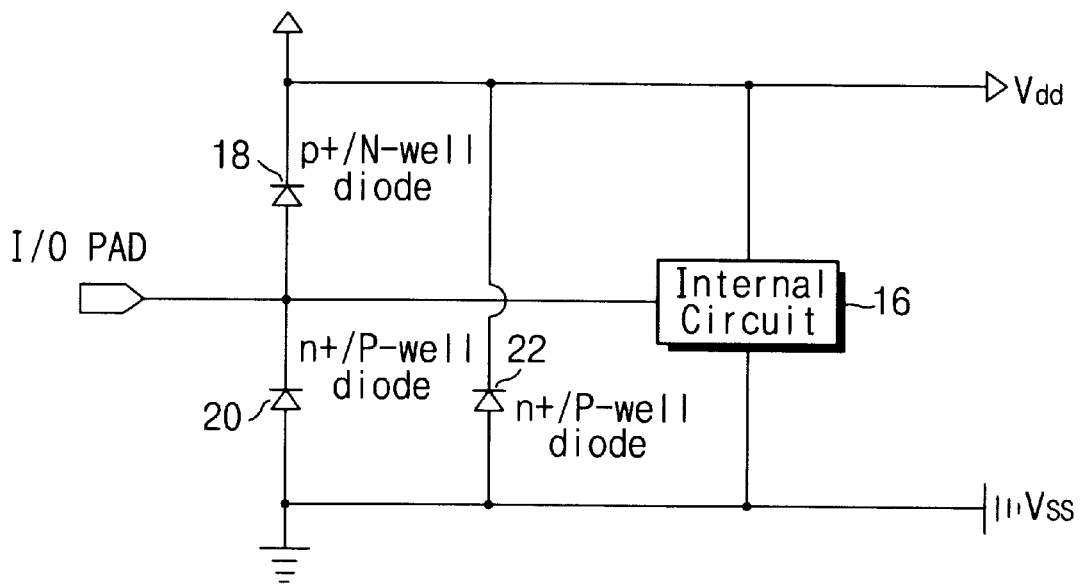
FIG. 1 is a circuit diagram illustrating a conventional ESD protecting circuit.
Figure 3:
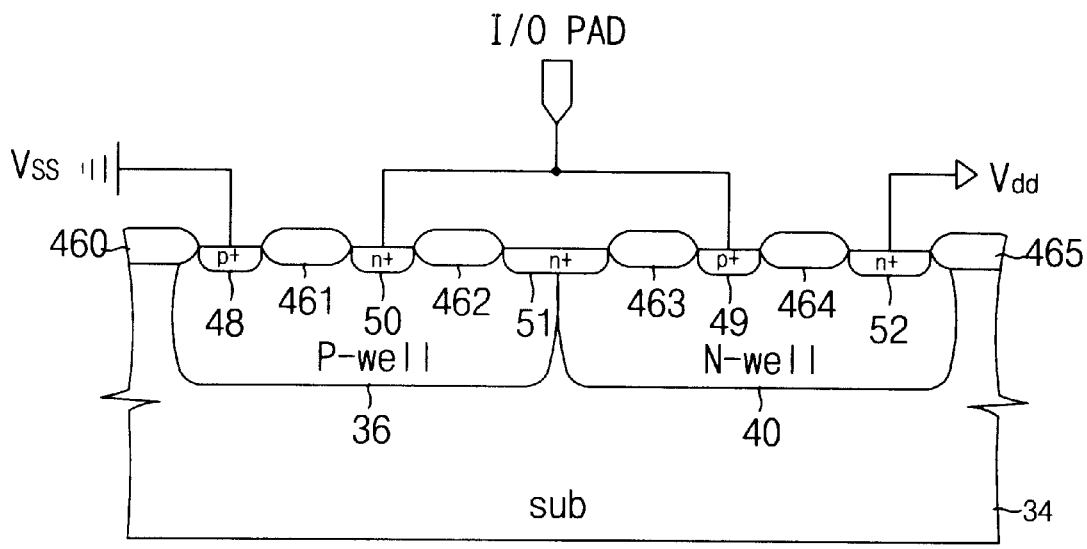
FIG. 3 is a sectional view illustrating a detailed structure of the ESD protecting circuit according to the present invention.

Referring to FIG. 3, the ESD protecting circuit according to the preferred embodiment of the present invention includes a P-well region 36 and an N-well region 40. The P-well region 36 is formed by implanting P-type impurity ions into a semiconductor substrate 34. Also, the N-well region 40 is formed by implanting N-type impurity ions into the semiconductor substrate 34, being adjacent to the P-well region 36. For the isolation between active regions, a plurality of field oxide layers 460 to 465, which are spaced apart from one another, are formed in order to define active and non-active regions in the same manner as that shown in FIG. 1. Further, P+-type impurity regions 48 and 49 and N+-type impurity regions 50 to 52 are also formed between the field oxide layers 460 to 465, respectively. At this time, the concentration of the P+-type impurity regions 48 and 49 is higher than that of the P-well regions 36 and also the concentration of the N+-type impurity regions 50 to 52 is higher than that of the N-well regions 40.

Figure 2:
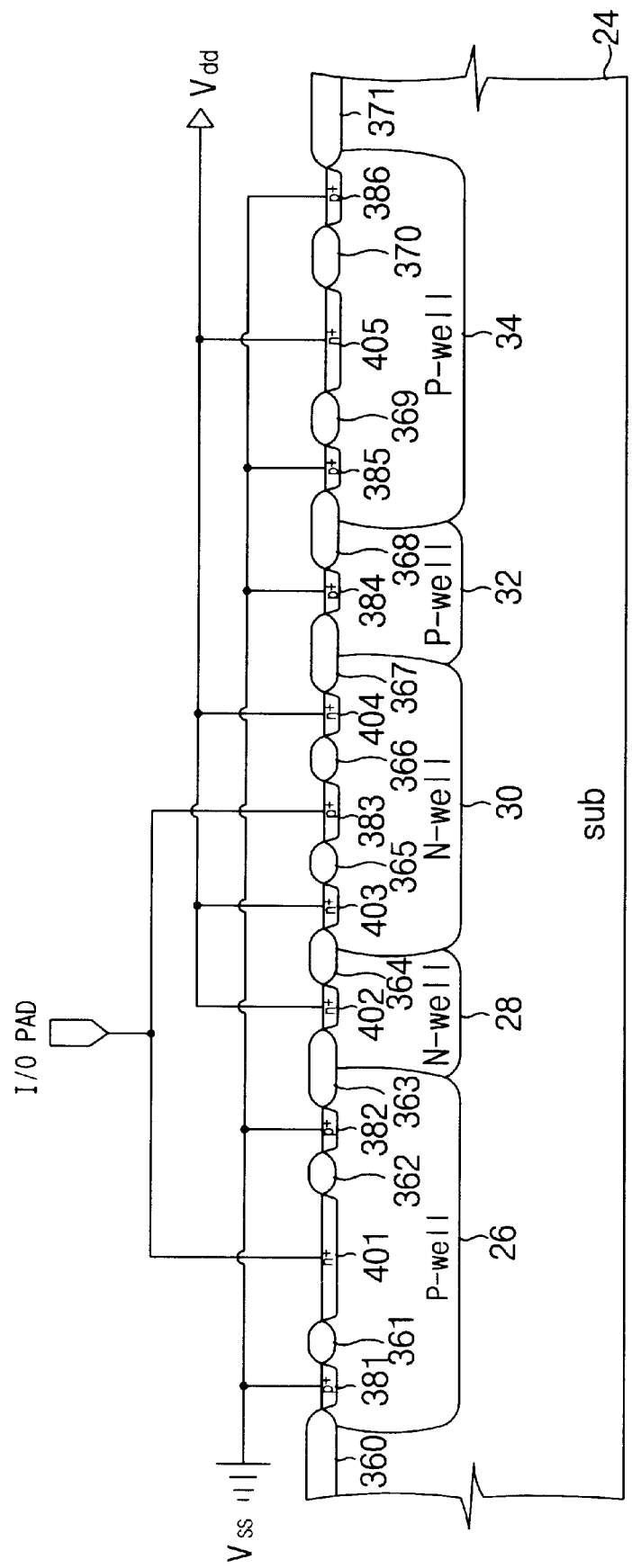
FIG. 2 is a sectional view illustrating a detailed structure of the ESD protecting circuit shown in FIG. 1.

Referring again to FIG. 2, in the conventional ESD protecting circuit, the field oxide layers are formed in the junction between the wells. The present invention, however, includes an active region formed in the junction between the p-well 36 and the N-well 40. That is, an N+-type impurity regions 51 is formed instead of the field oxide layer, thereby being in contact with both the p-well 36 and the N-well 40. Accordingly, it is possible to form an N+/P-well diode between a power supply Vdd and a ground voltage level Vss through the N+-type impurity region 51. On the other hand, the ground voltage level Vss is coupled to the P+-type impurity region 48 in the P-well 36, a power supply Vdd is coupled to the N+-type impurity region 52 in the N-well 36, and an I/O pad is coupled to not only the P+-type impurity region 49 in the N-well 40 but also to the N+-type impurity region 50 in the P-well 36.

As described above, the ESD protecting circuit of the present invention may provide three current discharging paths in the formation of only one P-well 36 and one N-well 40 in the semiconductor substrate 34. In other words, the first current discharging path between the I/O pad and the ground voltage level Vss is formed by the N+/P-well diode due to the junction of the P-well 36 and the N+-type impurity region 50. The second current discharging path between the I/O pad and the power supply Vdd is formed by the P+/N-well diode due to the junction of the P+-type impurity region 49 and the N-well region 40, and, between the ground voltage level Vss and the power supply Vdd, the third current discharging path is formed by the N+/P-well diode due to the junction of the N+-type impurity region 52 and the P-well region 36 through the N+-type impurity region 51. As a result, these three current discharging paths protect the internal circuit of the semiconductor device from overvoltage which is input from an external circuit.

As apparent from the above description, the present invention provides an ESD protecting circuit for a semiconductor circuit device, which comprises only two wells and a highly doped region which brings an N-well into an electrical connect with a P-well. Accordingly, the present invention provides the effects of reducing the area of the ESD protecting circuit and removing an instant ESD impact.

What is claimed is:

1. An electrostatic discharge (ESD) protecting circuit, which is formed on a semiconductor substrate, including a first current discharging path between an input/out pad and a first power supply, a second current discharging path between said input/out pad and a second power supply and a third current path between said first power supply and said second power supply, said ESD protecting circuit comprising:

a first N+-type impurity region formed on both a p-well and an N-well which are formed in said semiconductor substrate in order to form said third current path, wherein said P-well is in contact with said N-well, whereby an N+/P-well diode is formed between said first power supply and said second power supply.

2. The ESD protecting circuit in accordance with claim 1, wherein said input/output pad is coupled to a first P+-type impurity region formed on said N-well.

3. The ESD protecting circuit in accordance with claim 2, wherein said input/output pad is coupled to a second N+-type impurity region formed on said P-well.

4. The ESD protecting circuit in accordance with claim 3, wherein said first power supply is in a ground voltage level, coupled to a second P+-type impurity region formed on said P-well.

5. The ESD protecting circuit in accordance with claim 3, wherein said second power supply is coupled a third N+-type impurity region formed on said N-well.

6. An electrostatic discharge (ESD) protecting circuit for a semiconductor device, said ESD protecting circuit comprising:

an N-well formed in a semiconductor substrate;

a P-well formed in a semiconductor substrate, being in contact with said N-well;

an N+/P-well diode formed on said P-well to form a first current path between an input/out pad and a first power supply;

a P+/N-well diode formed on said N-well to form a second current path between said input/out pad and a second power supply; and a first N-type impurity region electrically coupling said N-well to said P-well to form a third current path between said first power supply and said second power supply.

7. The ESD protecting circuit in accordance with claim 6, wherein said input/output pad is coupled to a first P+-type impurity region formed on said N-well.

8. The ESD protecting circuit in accordance with claim 7, wherein said input/output pad is coupled to a second N+-type impurity region formed on said P-well.

9. The ESD protecting circuit in accordance with claim 8, wherein said first power supply is in a ground voltage level, coupled to a second P+-type impurity region formed on said P-well.

10. The ESD protecting circuit in accordance with claim 8, wherein said second power supply is in contact with a third N+-type impurity region formed on said N-well.

11. A semiconductor circuit device including an input/output pad, a first power supply, a second power supply and an internal circuit, said semiconductor circuit comprising:

an electrostatic discharge (ESD) protecting circuit for protecting said internal circuit from overvoltage input from an external circuit, said ESD protecting circuit including:

a first well region formed in a semiconductor substrate with a first impurity type;

a second well region formed in said semiconductor substrate with a second impurity type, being in contact with said first well region;

a plurality of field regions spaced apart from one another;

a first impurity region formed on both said first well region and said second well region;

a second impurity region formed on said first well region, coupled to said input/output pad;

a third impurity region formed on said second well region, coupled to said input/output pad;

a fourth impurity region formed on said first well region, coupled to said first power supply; and a fifth impurity region formed on said second well region, coupled to said second power supply.

12. The semiconductor circuit device in accordance with claim 11, wherein said first and second well regions are a P-well and an N-well, respectively.

13. The semiconductor circuit device in accordance with claim 12, wherein said first impurity region is the same impurity type as said second well region.

14. The semiconductor circuit device in accordance with claim 13, wherein said second impurity region is the same impurity type as said second well region and said third impurity region is the same impurity type as said first well region.

15. The semiconductor circuit device in accordance with claim 14, wherein said fourth impurity region is the same impurity type as said first well region and said fifth impurity region is the same impurity type as said second well region.

* * * * *

UNITED STATES PATENT AND TRADEMARK OFFICE
CERTIFICATE OF CORRECTION

PATENT NO.    : 5,898,193
DATED         : April 27, 1999
INVENTOR(S)   : Ham

It is certified that error appears in the above-identified patent and that said Letters Patent is hereby corrected as shown below:

<u>Title page,</u>
Item [57], ABSTRACT,
Line 8, "present invention provides effects of reducing" should read -- present invention provides the effect of reducing --.

<u>Column 1,</u>
Line 10, "capable of protecting an internal circuit in a semiconductor device, by minimizing the occupying area thereof." should read -- capable of occupying a minimized area thereof. --.
Line 13, "In general, an electrostatic discharge protecting circuit has been" should read -- In general, electrostatic discharge protecting circuits have been --.
Line 14, "prevent overvoltage from" should read -- prevent overvoltages from --.
Line 15, "to the internal circuit in the semiconductor device." should read -- to internal circuits in the semiconductor devices. --.
Line 19, "as an ESD) protecting" should read -- as "ESD") protecting --.
Line 29, "the ground voltage level Vss." should read -- the power supply ground Vss. --.
Line 31, "the ground voltage level Vss." should read --the power supply ground Vss.--.
Line 55, "one of N+type" should read -- one of the N+type --.
Line 56, "26 and 34, for example, the N+type impurity region 401 and" should read -- 26 and 34 (for example, the N+type region 401) and --.
Line 58, "region 30 are" should read -- region 30, are --.
Line 59, "region 34 are connected" should read -- region 34 is connected --.
Line 61, "As described above, between" should read -- As described above, the first current discharging path between --.
Line 62, "supply Vdd, the first current discharging path is formed" should read -- supply Vdd is formed --.

<u>Column 2,</u>
Line 1, "26, and between" should read -- 26, and the third current discharging path, between --.
Line 7, "discharging paths, it has problems in that the lay-out is very" should read -- discharging paths, the lay-out is very --.
Line 8, "complicated and it is in need of a large area" should read -- complicated and requires a large area --.
Line 15, "capable of minimizing its area." should read -- capable of occupying a minimized area. --.
Line 16, "with an aspect" should read -- with a first aspect --.
Line 43, "with further another aspect" should read -- with a further aspect --.

UNITED STATES PATENT AND TRADEMARK OFFICE
CERTIFICATE OF CORRECTION

PATENT NO.    : 5,898,193
DATED         : April 27, 1999
INVENTOR(S)   : Ham

It is certified that error appears in the above-identified patent and that said Letters Patent is hereby corrected as shown below:

Column 3,
Line 3, "illustrating a detailed" should read -- illustrating the detailed --.
Line 6, "structure of the ESD protecting" should read -- structure of an ESD protecting --.
Line 14, "according to the preferred" should read -- according to a preferred --.
Line 19, "substrate 34, being adjacent" should read -- substrate 34, adjacent --.
Line 24, "are also formed" should read -- are formed --.
Line 25, "respectively. At this time, the concentration" should read -- respectively. The concentration --.
Line 27, "regions 36 and also the concentration" should read -- regions 36, and the concentration --.
Line 34, "impurity regions 51 is formed" should read -- impurity region 51 is formed --.
Line 35, "oxide layer, thereby being in contact" should read -- oxide layer, wherein the impurity region 51 is in contact --.
Line 44, "N-well 40 but also" should read -- N-well 40, but also --.
Line 46, "above, the ESD protecting circuit of the" should read -- above, an ESD protecting circuit according to the --.
Line 47, "invention may provide three" should read -- invention provides three --.
Line 48, "paths in the formation" should read -- paths with the formation --.
Line 49, "substrate 34. In other words, the first current" should read -- substrate 34. The first current --.
Line 51, "level Vss is formed by the N+/P-well diode due to the junction" should read -- level Vss is provided by the N+/P-well diode fromed from the junction --.
Line 54, "Vdd is formed by the" should read -- Vdd is provided by the --.
Line 55, "diode due to the junction" should read -- diode formed from the junction --.
Line 56, "region 40, and, between the ground voltage 1" should read -- region 40, and the third current discharging path between the ground voltage 1 --.
Line 57, "supply Vdd, the third current discharging path is formed" should read -- supply Vdd, is provided by the --.

UNITED STATES PATENT AND TRADEMARK OFFICE
CERTIFICATE OF CORRECTION

PATENT NO. : 5,898,193
DATED : April 27, 1999
INVENTOR(S) : Ham

It is certified that error appears in the above-identified patent and that said Letters Patent is hereby corrected as shown below:

<u>Column 3, cont'd,</u>
Line 59, "diode due to the junction" should read -- diode formed from the junction --.
Line 65, "circuit device, which comprises" should read -- circuit device which comprises --.

Signed and Sealed this

Twenty-seventh Day of January, 2004

JON W. DUDAS
*Acting Director of the United States Patent and Trademark Office*